(12) United States Patent
Iwata (10) Patent No.: US 9,099,503 B2
(45) Date of Patent: Aug. 4, 2015

(54) PLASMA PROCESSING APPARATUS

(75) Inventor: Manabu Iwata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1544 days.

(21) Appl. No.: 12/253,480

(22) Filed: Oct. 17, 2008

(65) Prior Publication Data

US 2009/0101283 A1    Apr. 23, 2009

Related U.S. Application Data

(60) Provisional application No. 61/017,270, filed on Dec. 28, 2007.

(30) Foreign Application Priority Data

Oct. 18, 2007 (JP) ................................ 2007-271562

(51) Int. Cl.
| | | |
|---|---|---|
| C23C 16/50 | (2006.01) | |
| C23C 16/00 | (2006.01) | |
| C23F 1/00 | (2006.01) | |
| H01L 21/306 | (2006.01) | |
| H01L 21/67 | (2006.01) | |
| H03H 7/38 | (2006.01) | |
| H01J 37/32 | (2006.01) | |
| H03H 7/40 | (2006.01) | |

(52) U.S. Cl.
CPC ..... H01L 21/67069 (2013.01); H01J 37/32027 (2013.01); H01J 37/32082 (2013.01); H01J 37/32091 (2013.01); H01J 37/32174 (2013.01); H01J 37/32183 (2013.01); H03H 7/38 (2013.01); H03H 7/40 (2013.01)

(58) Field of Classification Search
CPC .................................................. H01J 37/32183
USPC ......... 118/715, 719, 722, 723 R; 156/345.43, 156/345.44
See application file for complete search history.

(56) References Cited

U.S. PATENT DOCUMENTS

| | | | | |
|---|---|---|---|---|
| 6,136,388 | A | * | 10/2000 | Raoux et al. ................... 427/569 |
| 2003/0037881 | A1 | | 2/2003 | Barnes et al. |
| 2004/0035365 | A1 | * | 2/2004 | Yamazawa et al. ....... 118/723 E |
| 2004/0118344 | A1 | * | 6/2004 | Ni et al. ..................... 118/723 E |
| 2006/0037703 | A1 | * | 2/2006 | Koshiishi et al. ......... 156/345.47 |
| 2006/0066247 | A1 | * | 3/2006 | Koshiishi et al. ......... 315/111.21 |

FOREIGN PATENT DOCUMENTS

| | | |
|---|---|---|
| JP | 2002-343768 | 11/2002 |
| JP | 2005-500684 | 1/2005 |
| JP | 2006-270019 | 10/2006 |

* cited by examiner

*Primary Examiner* — Maureen Gramaglia
*Assistant Examiner* — Tiffany Nuckols
(74) *Attorney, Agent, or Firm* — Rothwell, Figg, Ernst & Manbeck, P.C.

(57) ABSTRACT

In a plasma etching apparatus, a first high frequency for plasma generation and a second high frequency for ion attraction are respectively applied from two high frequency supplies to a susceptor. Further, DC voltage is applied from a variable DC power supply to an upper electrode via a filter circuit. An annular DC ground part attached to an upper side surface of the susceptor is connected to a filter circuit. This filter circuit allows a specific frequency component of the intermodulation distortion generated in a plasma by a series resonant to selectively flow to a ground line.

19 Claims, 3 Drawing Sheets

PLASMA PROCESSING APPARATUS

FIELD OF THE INVENTION

The present invention relates to a technique for performing plasma processing on a substrate to be processed; and, more particularly, to a capacitively coupled plasma processing apparatus.

BACKGROUND OF THE INVENTION

In a manufacturing process of a semiconductor device or an FPD (flat panel display), a plasma is often used in processes, e.g., etching, deposition, oxidation, sputtering and the like, in order to allow a processing gas to react efficiently at a relatively low temperature. Conventionally, a capacitively coupled plasma processing apparatus capable of producing a large-diameter plasma has been mainly used for a single-wafer plasma processing apparatus.

Generally, in the capacitively coupled plasma processing apparatus, an upper and a lower electrode are disposed in parallel with each other in a vacuum processing chamber, and a substrate to be processed (e.g., a semiconductor wafer, a glass substrate or the like) is mounted on the lower electrode. When a high frequency is applied to one of the electrodes, electrons accelerated by a high frequency electric field between the electrodes, secondary electrons emitted from the electrodes, and heated electrons collide with molecules of a processing gas. Accordingly, a plasma of the processing gas is generated, and a required microprocessing, e.g., etching, is performed on a substrate surface by radicals or ions in the plasma. In the etching process, there is widely used a dual frequency application mode in which a relatively high frequency (normally higher than or equal to about 40 MHz) for plasma generation (discharge) is applied to any one of the upper and the lower electrode and a relatively low frequency (lower than or equal to about 13.56 MHz) for ion attraction to the substrate is applied to the lower electrode.

Japanese Patent Laid-open Publication No. 2006-270019 discloses a type of the capacitively coupled plasma processing apparatus in which a plasma is generated between two electrodes by a high frequency discharge while a DC voltage is applied to an upper electrode facing a substrate via the plasma (hereinafter, referred to as a "DC voltage application type"). In the DC voltage application type, at least one of following effects (basic effects) can be obtained: (1) sputtering effect (deposit removal effect) on the upper electrode is enhanced by increasing an absolute value of a self-bias voltage of the upper electrode; (2) the generation amount of plasma is reduced by enlarging a plasma sheath with respect to the upper electrode; (3) electrons generated near the upper electrode are irradiated onto a substrate to be processed; (4) a plasma potential can be controlled; (5) electron density (plasma density) is increased; and (6) the plasma density in the central portion is increased. Based on the above basic effects, plasma ignition stability, resist selectivity, etching rate and etching uniformity (process characteristic effects) are improved in the etching process.

In the capacitively coupled plasma processing apparatus employing the above DC voltage application type, when a DC voltage is applied to the upper electrode, electrons are accumulated on the upper electrode, which may cause an abnormal discharge between the inner wall of the chamber and the upper electrode. To that end, a DC ground electrode referred to as a DC ground part or a DC block is provided on, e.g., the inner wall of the chamber. The DC ground part is a conductive member made of, e.g., Si, SiC or the like, and is installed at a portion exposed to the plasma on the inner wall of the chamber. The electrons accumulated on the upper electrode pass through the plasma to reach the DC ground part, and then flow to a ground line via the inner wall of the chamber.

However, when deposits such as polymer and the like generated during the etching process are adhered to the surface of the DC ground part, the DC ground function deteriorates and, further, the basic effects of the DC voltage application type or the process characteristic effects decrease.

Conventionally, in order to prevent or reduce the adhesion of deposits to the DC ground part, the DC ground part, which has been connected to the ground line during the etching processing, is supplied with a negative DC voltage when performing cleaning of the DC ground part (plasma cleaning). As a result, a plasma sheath near the DC ground part is made to be enlarged and bombardments of ions accelerated by an average electric field of the plasma sheath to the DC ground part are strengthened to thereby enhance ion sputtering effect and remove the deposits from the surface of the DC ground part.

However, the method for cleaning the DC ground part is disadvantageous in that the cleaning process is required in addition to the etching process, and thus the production efficiency decreases. Besides, in order to improve the cleaning efficiency of the cleaning technique using the sputtering of ions accelerated by the average electric field of the plasma sheath, the DC bias applied to the DC ground part needs to be markedly increased, and an installation cost of the DC power supply or a manufacturing cost of the high pressure power supply line increases.

SUMMARY OF THE INVENTION

In view of the above, the present invention provides a capacitively coupled plasma processing apparatus capable of improving plasma processing by effectively removing undesirable deposits adhered on a DC ground electrode used in a DC voltage application type with a simple configuration and ensuring a DC ground function.

The present invention also provides a capacitively coupled plasma processing apparatus capable of improving performance thereof by allowing the DC ground electrode used in the DC voltage application type to perform not only the DC ground function but also other functions.

In accordance with an aspect of the present invention, there is provided a plasma processing apparatus including a vacuum-evacuable processing chamber; a first electrode for mounting thereon a substrate to be processed in the processing chamber; a second electrode facing the first electrode in parallel in the processing chamber; and a processing gas supply unit for supplying a processing gas to a processing space between the first electrode and the second electrode; a first high frequency power supply for applying a first high frequency for plasma generation of the processing gas to at least one of the first and the second electrode.

The plasma processing apparatus further includes a second high frequency power supply for applying a second high frequency for ion attraction from the plasma to the substrate to the first electrode; a DC power supply for applying a DC voltage to a specific member exposed to the plasma in the processing chamber; one or more DC ground electrodes grounded in a DC manner and provided at a portion exposed to the plasma in the processing chamber, for allowing a DC current to flow through the plasma between the DC ground electrodes and the specific member to which the DC voltage is applied; and one or more filter circuits for selectively passing a frequency component of a predetermined frequency generated by intermodulation between the first and the second high frequency to a ground line via the DC ground electrodes.

In the above configuration, the processing gas is excited by the first high frequency in the processing space between the first and the second electrode and then discharge occurs, so that the radicals in the plasma are supplied to the substrate. Further, the ions in the plasma are attracted by the second high frequency bias to thereby be supplied to the substrate. Furthermore, the DC voltage is applied from the DC power supply to the member to which the DC voltage is applied, and the electrons accumulated near the specific member pass through the plasma to reach the DC ground electrodes, and then flow to the ground line.

Meanwhile, when the first and the second high frequency are simultaneously applied to the plasma serving as a nonlinear transmission circuit, a plurality of harmonic frequency component is generated by intermodulation between two frequencies in the plasma. In accordance with the present invention, a specific frequency component among the plurality of frequency components is selectively taken by the filter circuits to be made to flow through into the ground line. Accordingly, the specific frequency component generated in the plasma flows concentratedly into the DC ground electrodes. Due to the specific frequency component, the DC ground electrodes are bombarded by the ions, and the electrode surface is cleaned by the ion sputtering effect.

The filter circuits may include a series resonant circuit having a resonant frequency close to the frequency of the frequency component. Accordingly, the selectivity to the specific frequency component can be increased. Specifically, the filter circuits may include a first inductor having one terminal electrically connected to the DC ground electrodes; a capacitor having one terminal electrically connected to the other terminal of the first inductor and the other terminal of the capacitor electrically connected to a ground line; and a second inductor having one terminal electrically connected to the other terminal of the first inductor and the other terminal of the second inductor electrically connected to the ground line, and wherein the first inductor and the capacitor form the series resonant circuit, and a transmission path having a minimum impedance to the specific frequency component is formed. Meanwhile, a DC series circuit for connecting the DC ground electrode to the ground line in a DC manner is formed by the first and the second inductor. The capacitor is preferably a variable capacitor.

The frequency of the frequency component is preferably lower than both of the first and the second high frequency. Further, the frequency of the frequency component is preferably lower than an ion plasma frequency of the plasma, or lower than or equal to 3 MHz. As a consequence, the ions in the plasma respond to the specific frequency component, so that the ion bombardment effect or the cleaning effect can be increased.

Further, the second electrode may be installed at the chamber via an insulating member or a space; the first high frequency power supply applies the first high frequency to the first electrode; and the DC power supply applies the DC voltage to the second electrode. In this case, an additional filter circuit is provided between the DC power supply and the second electrode. This filter circuit enables a DC voltage from the DC power supply to be applied to the second electrode, and also allows the high frequency flowing from the first electrode to the second electrode via the processing space to flow toward the ground line, not toward the DC power supply.

The DC ground electrodes may be provided at arbitrary locations which face the plasma in the chamber. However, the DC ground electrodes are preferably attached in an electrically floating state to a side surface of the first electrode or to a wall of the processing chamber.

A plurality of filter circuits is preferably connected in parallel to the DC ground electrode, and each of the filter circuits independently selects the frequency of the frequency component to pass therethrough selectively. Further, it is preferable that the DC ground electrodes are provided at a plurality of different places in the processing chamber, and the filter circuits are connected to the respective DC ground electrodes. In this case, each of the filter circuits may independently select the frequency of the frequency component to pass therethrough selectively.

In accordance with another aspect, there is provided a plasma processing apparatus including a vacuum-evacuable processing chamber; a first electrode for mounting thereon a substrate to be processed in the processing chamber; a second electrode facing the first electrode in parallel in the processing chamber; a processing gas supply unit for supplying a processing gas to a processing space between the first electrode and the second electrode; and a high frequency power supply for applying one or more frequencies to at least one of the first and the second electrode.

The plasma processing apparatus further includes a DC power supply for applying a DC voltage to a specific member exposed to the plasma in the processing chamber; a DC ground electrode grounded in a DC manner and provided at a portion exposed to the plasma in the processing chamber, for allowing a DC current to flow through the plasma between the DC ground electrode and the specific member to which the DC voltage is applied; and a filter circuit for selectively passing a frequency component of a specific frequency generated by distortion caused by non-linearity of the plasma or any one of the high frequencies to a ground line via the DC ground electrode.

In the above configuration, a DC voltage is applied from the DC power supply to the specific member in accordance with the DC voltage application type. Accordingly, the electrons accumulated near the specific member pass through the plasma to reach the DC ground electrode, and then flow into the ground line. Further, a high frequency inputted into the plasma or the specific frequency component generated by the distortion in the plasma is selectively taken by the filter circuit, and flows to the ground line via the DC ground electrode. As a consequence, the DC ground electrode can perform not only the DC ground function but also the function of modifying high frequency transmission path distribution in the plasma for high frequency discharge or the function of releasing an undesired frequency component to the outside of the processing chamber.

In accordance with the above-described configuration and operation of the present invention, it is possible to improve the plasma processing by effectively removing undesired deposits adhered on the DC ground electrode used in the DC voltage application type with a simple configuration and ensuring a DC ground function effectively. Further, the DC ground electrode can effectively perform not only the DC ground function, but also other functions, so that the apparatus performance can be further improved.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Embodiments of the present invention will be described with reference to the accompanying drawings which form a part hereof.

Figure 1:
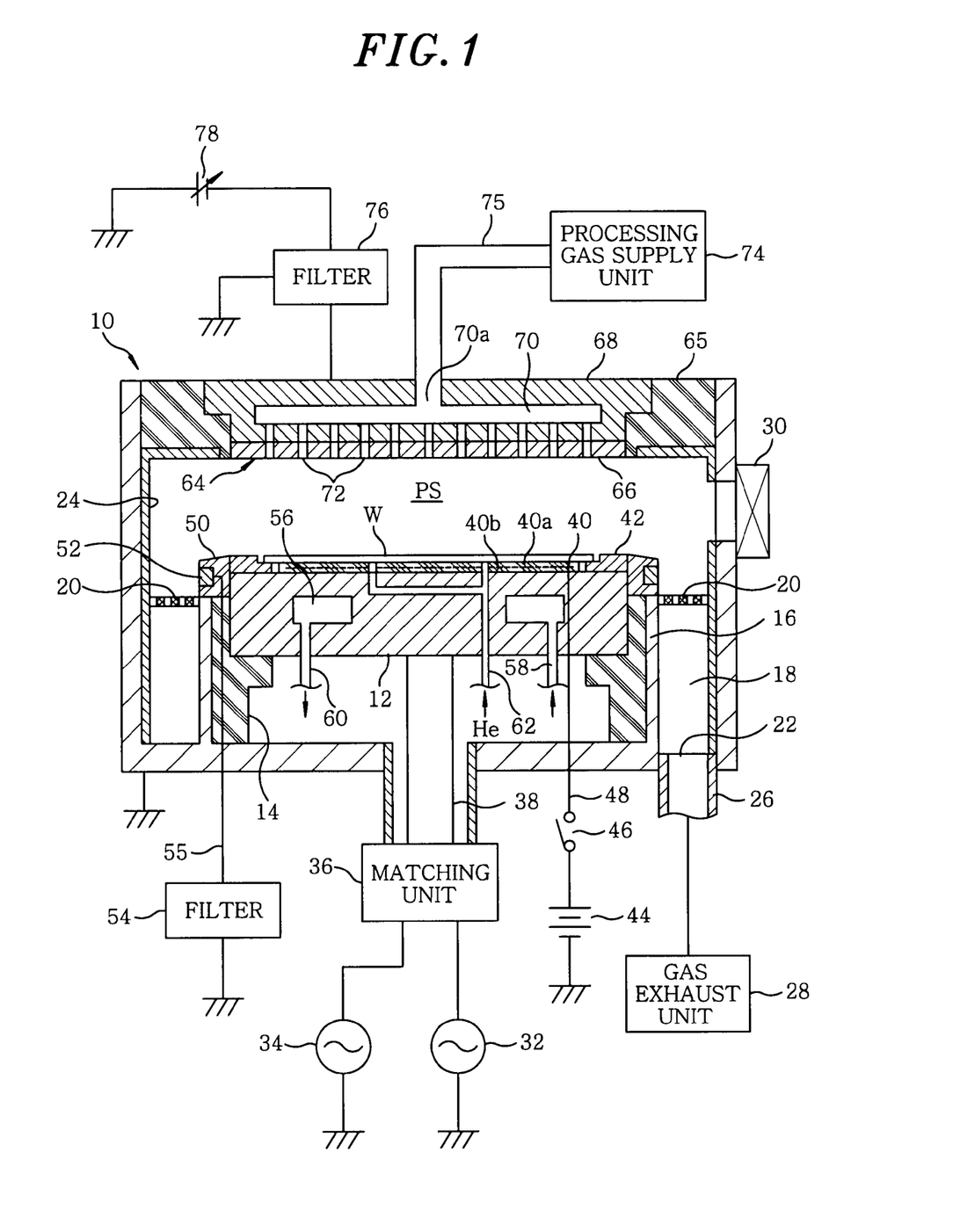
FIG. 1 is a vertical cross sectional view showing a configuration of a plasma etching apparatus in accordance with an embodiment of the present invention.

FIG. 1 shows a configuration of a plasma etching apparatus in accordance with an embodiment of the present invention. The plasma etching apparatus is configured as a capacitively coupled plasma etching apparatus having parallel plate electrodes, and includes a cylindrical chamber (processing chamber) 10 made of a metal such as aluminum, stainless steel or the like. The chamber 10 is frame grounded.

A circular plate-shaped susceptor 12 serving as a lower electrode for mounting thereon a substrate to be processed, e.g., a semiconductor wafer W, is disposed horizontally in the chamber 10. The susceptor 12 is made of, e.g., aluminum, and is supported by a cylindrical insulating support 14 made of, e.g., ceramic, which vertically extends from a bottom of the chamber 10, without being grounded.

An annular gas exhaust line 18 is formed between the inner wall of the chamber 10 and a cylindrical conductive supporting portion 16 vertically extending from the bottom of the chamber 10 along the periphery of the cylindrical insulating support 14. An annular baffle plate 20 is disposed at an upper portion or an entrance of the gas exhaust line 18 and, also, a gas exhaust port 22 is provided at a bottom portion thereof. A shield member 24 for preventing adhesion of any etching by-product is detachably attached along the inner wall of the chamber 10. Further, although not shown, the same shield member may be provided on a sidewall of the susceptor 12.

A gas exhaust unit 28 is connected to the gas exhaust port 22 via a gas exhaust line 26. The gas exhaust unit 28 has a vacuum pump such as a turbo molecular pump or the like, so that a plasma processing space in the chamber 10 can be depressurized to a desired vacuum level. Provided on a sidewall of the chamber 10 is a gate valve 30 for opening and closing a loading/unloading port for the semiconductor wafer W.

A first and a second high frequency power supply 32 and 34 are electrically connected to the susceptor 12 via a matching unit 36 and a power feed rod 38. Here, the first high frequency power supply 32 outputs a first high frequency power of a relatively high frequency of, e.g., 40.68 MHz, for plasma generation. Meanwhile, the second high frequency power supply 34 outputs a second high frequency power of a relatively low frequency of, e.g., 12.88 MHz, for ion attraction onto the semiconductor wafer W mounted on the susceptor 12. The matching unit 36 includes a first matcher for matching an impedance of the first high frequency power supply 32 with that of the loads (mainly, the electrode, the plasma and the chamber) and a second matcher for matching an impedance of the second high frequency power supply 34 with that of the loads.

Disposed on the top surface of the susceptor 12 is an electrostatic chuck 40 for supporting the semiconductor wafer W by an electrostatic attractive force. An annular focus ring 42 surrounding the periphery of the semiconductor wafer W is provided at an outer side in a radius direction of the electrostatic chuck 40. The electrostatic chuck 40 includes an electrode 40a made of a conductive film embedded between a pair of insulating films 40b. A high voltage DC power supply 44 is electrically connected to the electrode 40a via a switch 46 and a coated line 48. Due to a Coulomb force generated by a DC voltage applied from the DC power supply 44, the semiconductor wafer W can be attracted and held on the electrostatic chuck 40.

An insulating cover ring 50 made of, e.g., quartz, circumferentially covers the periphery of an upper side surface of the susceptor 12 and the periphery of the focus ring 42. In this embodiment, the cover ring 50 has an annular DC ground part (DC ground electrode) 52 formed of a conductive member made of, e.g., Si, SiC or the like. The DC ground part 52 is electrically connected to a filter circuit 54 disposed outside the chamber 10 via, e.g., a coated line 55, and is constantly grounded in a DC manner via the coated line 55 and the filter circuit 54.

Installed in the susceptor 12 is an annular coolant path 56 extending in., e.g., a circumferential direction. A coolant, e.g., cooling water, of a predetermined temperature supplied from a chiller unit (not shown) is circulated in the coolant path 56 via lines 58 and 60. The processing temperature of the semiconductor wafer W on the electrostatic chuck 40 can be controlled by the temperature of the coolant. Further, a thermally conductive gas from a thermally conductive gas supply unit (not shown), e.g., He gas, is supplied between the top surface of the electrostatic chuck 40 and the backside of the semiconductor wafer W via a gas supply line 62. In addition, there are provided lift pins (not shown) penetrating the susceptor 12 in a vertical direction to load and unload the semiconductor wafer W and an elevation mechanism thereof (not shown).

An upper electrode 64 serving as a shower head is provided to face the susceptor 12 in parallel at the ceiling of the chamber, the upper electrode 64 being electrically isolated from the chamber wall by an annular insulating member 65. The upper electrode 64 has an electrode plate 66 facing the susceptor 12 and an electrode holder 68 for attachably and detachably supporting the electrode plate 66 from the rear surface thereof. The electrode holder 68 has therein a gas chamber 70, and a plurality of gas injection openings 72 opened from the gas chamber 70 toward the susceptor 12 is formed in the electrode holder 68 and the electrode plate 66. A space between the electrode plate 66 and the susceptor 12 becomes a plasma generation space or a processing space PS. A gas supply line 75 from the processing gas supply unit 74 is connected to a gas inlet port 70a provided at a top portion of the gas chamber 70. Further, the electrode plate 66 is made of, e.g., Si or SiC, and the electrode holder 68 is made of, e.g., alumite processed aluminum.

A variable DC power supply 78 is electrically connected to the upper electrode 64 via a filter circuit 76. The filter circuit 76 applies a DC voltage from the variable DC power supply 78 to the upper electrode 64, and is configured to allow the first and the second high frequency applied from the susceptor 12 to the upper electrode 64 via the processing space PS to flow toward the ground line, not toward the variable DC power supply 78.

A control unit (not shown) includes, e.g., a micro computer, controls an operation (sequence) of the entire apparatus and an operation of each unit in the plasma etching apparatus such as the gas exhaust unit 28, the high frequency power supplies 32 and 34, the switch 46, the processing gas supply unit 74, the variable DC power supply 78 and the like.

To carry out an etching in the plasma etching apparatus, first of all, the gate valve 30 is opened. Next, a semiconductor wafer W to be processed is loaded into the chamber 10 and then is mounted on the electrostatic chuck 40. Thereafter, an etching gas (generally a gaseous mixture) from the processing gas supply unit 74 is introduced into the sealed chamber 10 at a predetermined flow rate and flow rate ratio, and the pressure in the chamber 10 is maintained to be a set value by the gas exhaust unit 28. Further, the first and the second high frequency power supply 32 and 34 are turned on, so that the first high frequency (40.68 MHz) and the second high frequency (12.88 MHz) are outputted at predetermined power levels to be supplied to the susceptor 12 via the matching unit 36 and the power feed rod 38. Further, the switch 46 is turned on to adsorb wafer W by electrostatic chuck 40, and a thermally conductive gas (He gas) is supplied in the contact surface between the electrostatic chuck 40 and the semiconductor wafer W. The etching gas injected through from the gas injection openings 72 of the upper electrode (shower head) 64 is converted to a plasma between both electrodes 12 and 64 by the high frequency discharge, and the main surface of the semiconductor wafer W is etched in a predetermined pattern by radicals or ions generated in the plasma.

In the capacitively coupled plasma etching apparatus, by applying the first high frequency power of a relatively high frequency, about 40.68 MHz, suitable for plasma generation to the susceptor 12, a high-density plasma in a desirable dissociation state can be generated even at a relatively low pressure level. At the same time, by applying the second high frequency power of a relatively low frequency, about 12.88 MHz, for ion attraction to the susceptor 12, an anisotropic etching can be performed on the semiconductor wafer W on the susceptor 12 with a high selectivity.

Further, in this plasma etching apparatus, a DC voltage of a predetermined value (e.g., −800 V to −1200 V) is applied from the variable DC power supply 78 to the upper electrode 64, so that the basic effects of the DC voltage application type can be realized and, also, it is possible to improve the etching processing characteristics such as plasma ignition stability, resist selectivity, etching rate and etching uniformity.

Besides, in this plasma etching apparatus, the plasma generated in the processing space PS reaches the side wall of the chamber 10 and extends to the vicinity of the baffle plate 20 in the gas exhaust space. Further, the DC ground part 52 installed on the upper side surface of the susceptor 12 is also exposed to the plasma. The electrons accumulated on the upper electrode 64 by the DC voltage application pass through the plasma to reach the DC ground part 52, and then flow into the ground line via the coated line 55 and the filter circuit 54. By releasing the electrons accumulated on the upper electrode 64 to the DC ground part 52, it is possible to prevent an abnormal discharge and obtain the basic effects of the DC voltage application type and the process characteristic effects.

This embodiment is characterized by the filter circuit 54 connected to the DC ground part 52. The filter circuit 54 has a function of effectively removing the deposits adhered to the ground parts 52 and ensuring the DC ground function, as will be described later.

Figure 2:
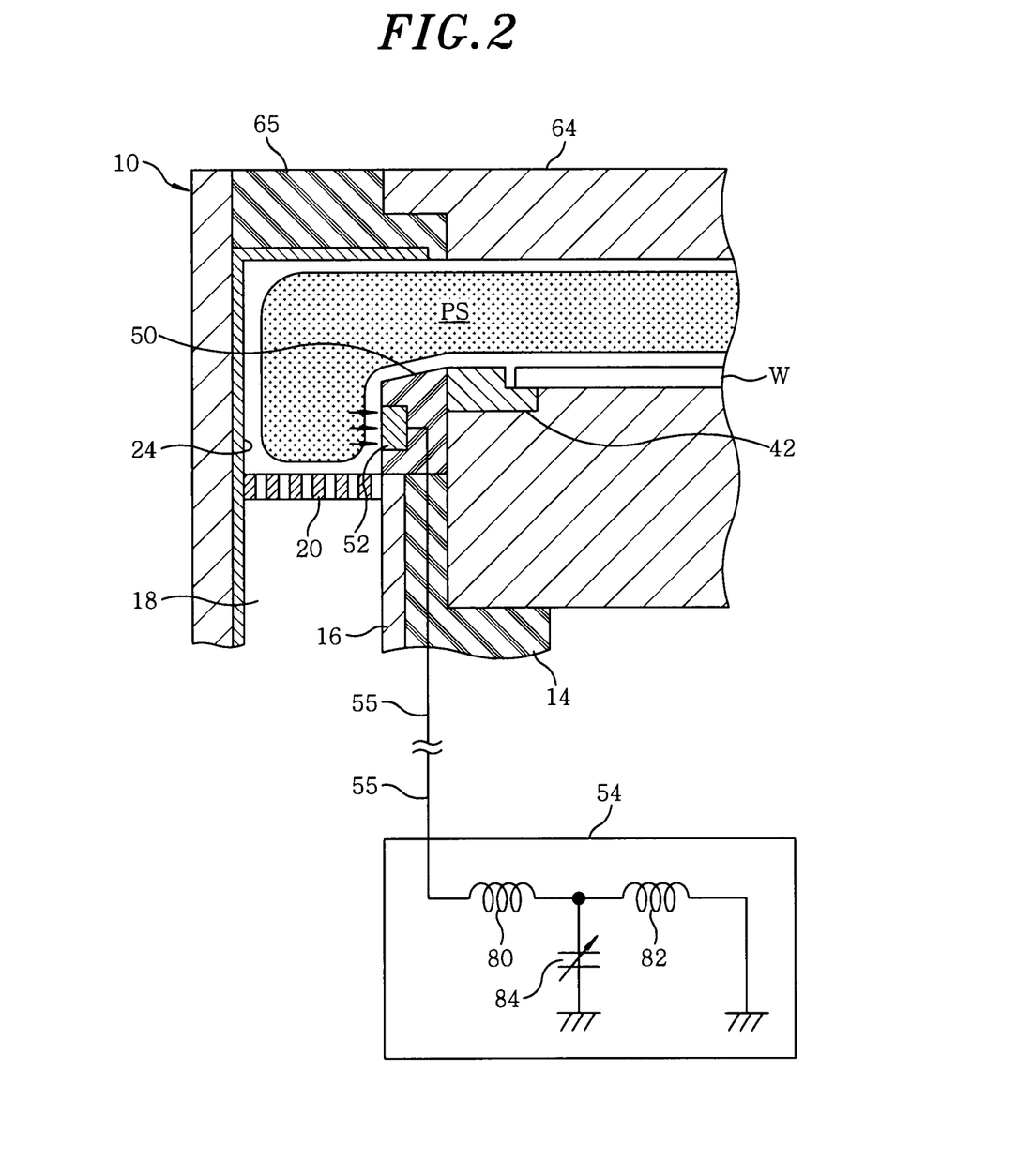
FIG. 2 provides an enlarged view of a structure near a DC ground part in the plasma etching apparatus in FIG. 1, and also illustrates an example of a circuit configuration of a filter circuit.

FIG. 2 provides an enlarged view of a structure near the DC ground part 52, and also illustrates an example of a circuit configuration of the filter circuit 54.

Referring to FIG. 2, the filter circuit 54 includes two inductors 80 and 82 and a capacitor 84. More specifically, one terminal of the first inductor 80 is electrically connected to the DC ground part 52 via the coated line 55 and the second inductor 82 and the capacitor 84 are electrically connected in parallel between the other terminal of the first inductor 80 and the ground lines. Here, the first inductor 80 and the capacitor 84 form a series resonant circuit. Further, the first and the second inductor 80 and 82 form a DC series circuit for allowing the DC ground part 52 to be grounded in a DC manner.

Resonant frequency of the series resonant circuit formed of the first inductor 80 and the capacitor 84 is set to be the same as or close to the frequency of the specific frequency component generated in the plasma by the intermodulation between the first frequency (40.68 MHz) and the second frequency (12.88 MHz) emitted from the susceptor 12 toward the processing space PS.

In other words, the plasma in the processing space PS serves as a nonlinear high frequency transmission circuit for the high frequency. Therefore, if the first and the second high frequency are input simultaneously, a plurality of frequency components referred to as a cross modulation distortion or an intermodulation distortion (IMD) is generated by intermodulation between both high frequencies ($f_1$ and $f_2$), as described in a following equation.

$$\pm m \times f_1 \pm n \times f_2 \ (m \text{ and } n \text{ being } 0,1,2,3,\dots)$$

In this embodiment, a fourth high frequency distortion among the plurality of intermodulation distortions, which satisfies m=+1 and n=−3, i.e., $f_1 - 3 \times f_2 = 2.04$ MHz, is selected as a specific frequency component, and the resonant frequency of the series resonant circuit is set to be close to about 2.04 MHz. For the tuning of the resonant frequency, it is preferable to use a variable capacitor as the capacitor 84.

The frequency (2.04 MHz) of the specific frequency component is set to be close to (preferably, equal to or less than) the ion plasma frequency of the plasma (generally 2 to 3 MHz) so that the ions can respond thereto.

With the configuration of the filter circuit 54 and the setting of the resonant frequency, a route where a specific frequency component (2.04 MHz) of the fourth high frequency distortion generated in the plasma flows from the DC ground part 52 to the ground line via the coated line 55 and the filter circuit 54 becomes a high frequency transmission path having a remarkably low impedance. Therefore, the high frequency of the specific frequency component (2.04 MHz) of the fourth high frequency distortion generated in the plasma flows concentratedly from the DC ground part 52 to the ground line via the coated line 55 and the filter circuit 54. Accordingly, an alternating electric field having a frequency (2.04 MHz) of the specific frequency component is generated in the ion sheath near the DC ground part 52, whereby the ions in the plasma bombard the DC ground part 52 at half cycle intervals to make the surface thereof sputter. Due to the ion sputtering effect, the deposits are hardly adhered to the surface of the DC ground part 52. Even if the deposits are adhered thereto, they can be removed quickly.

As described above, in the plasma etching apparatus of the present embodiment, the filter circuit 54 connected to the DC ground part 52 selectively allows the specific frequency component (2.04 MHz) of the intermodulation distortion generated in the plasma by the series resonant to flow to the ground line. During the etching process, the ions in the plasma respond to the specific frequency component and bombard the DC ground part 52. The ion sputtering effect prevents deposits from being adhered to the surface of the DC ground part 52. As a result, the DC ground function can be ensured during the etching process and, also, it is possible to improve plasma ignition stability, resist selectivity, etching rate and etching uniformity.

Moreover, the filter circuit 54 including passive devices such as the inductor, the capacitor and the like does not require a power supply circuit, and thus can be provided simply and at a low cost.

The frequency component of the intermodulation distortion generated in the plasma does not contribute to the plasma generation or the ion attraction. Moreover, when it flows into the matching unit 36 or the high frequency power supplies 32 and 34 via the power feed rod 38 and the like, the accuracy of the automatic matching deteriorates, or an undesired standing wave or a resonant state occurs in the high frequency transmission path, resulting in an unstable plasma. Accordingly, by releasing least a part (the specific frequency component) of the intermodulation distortion from the DC ground part 52 to the ground line via the filter circuit 54, the cleaning of the DC ground part 52 can be effectively performed and, also, realizing the secondary effects of preventing the inflow to the high frequency transmission path to thereby stabilize the plasma can be achieved.

The present invention can be variously modified without being limited to the aforementioned embodiment.

For example, the combination of the first and the second high frequency (40.68 MHz, 12.88 MHz) in the above embodiment is only an example. Therefore, any frequency combination can be employed as long as the aforementioned functions (plasma generation and ion attraction) can be achieved.

Figure 3:
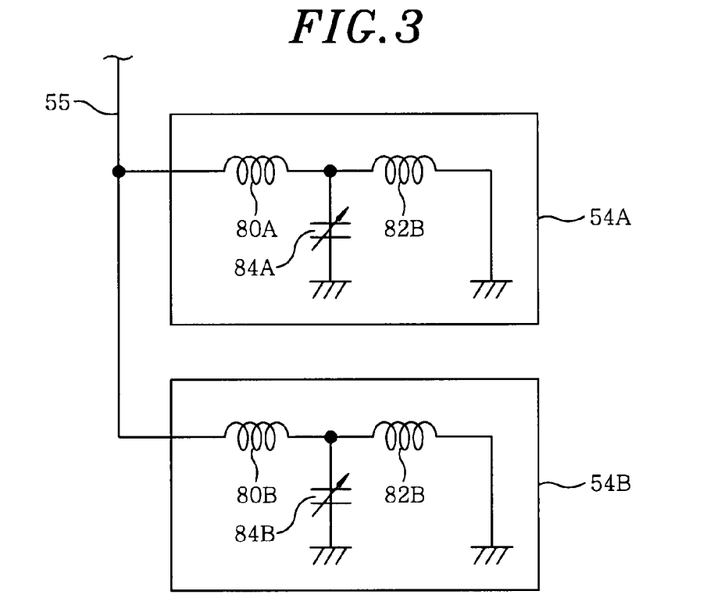
FIG. 3 describes a modification of the embodiment.

Further, a plurality of, e.g., two, filter circuits 54A and 54B, can be connected in parallel to a single DC ground part 52, as shown in FIG. 3. In this case, the first and the second filter circuit 54A and 54B can respectively allow a first and a second specific frequency component having different frequencies to pass therethrough selectively. Namely, in the first filter circuit 54A, a resonant frequency of the series resonant circuit formed of a first inductor 80A and a capacitor 84A is set to be close to a frequency of the first specific frequency component, and a resonant frequency of the series resonant circuit formed of a first inductor 80B and a conductor 84B is set to be close to a frequency of the second specific frequency component.

Moreover, the DC ground part can be installed at any place as long as it meets (is exposed to) the plasma in the chamber 1. Further, a plurality of DC ground parts can be provided at other places. For example, as in the example shown in FIG. 4, the first DC ground part 52A is installed on the sidewall of the chamber 10 or the shield member 24 via an insulating member 59, the first DC ground part 52A being electrically isolated from the chamber 10 and the shield member 24, and the second DC ground part 52B is buried in the insulating member 65 of the chamber ceiling portion.

Figure 4:
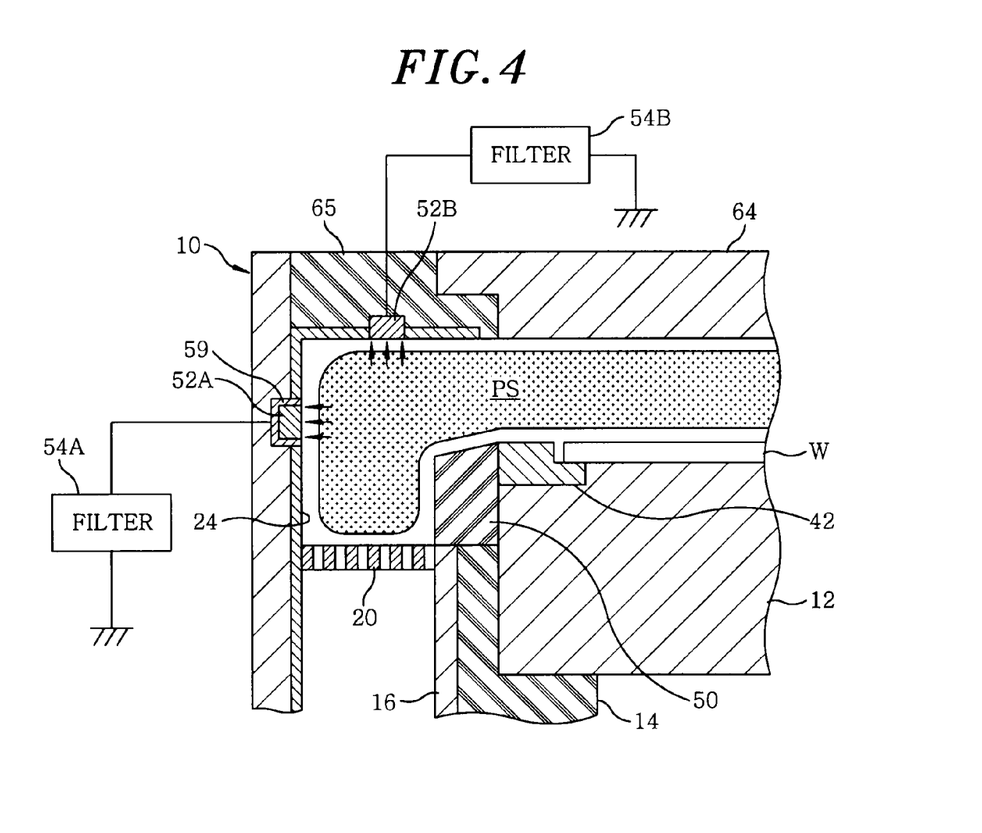
FIG. 4 depicts another modification of the embodiment.

Moreover, the first DC ground part 52A is connected to the ground line via the first filter circuit 54A, and the second DC ground part 52B is connected to the ground line via the second filter circuit 54B. In this case, the resonant frequencies in the first and the second filter circuit 54A and 54B can be set independently so as to be close to the frequency of the same frequency component or the frequencies of the different specific frequency components.

Further, at least one of the filter circuits 54A and 54B can selectively pass the high frequency or the frequency component other than the specific frequency component of the intermodulation distortion. For example, when the filter circuit 54A selectively passes the first high frequency for plasma generation via the first DC ground part 52A, the characteristics of the plasma density distribution in the radial direction can be corrected (uniformity correction) by increasing an electron current flowing toward the chamber sidewall compared to that flowing toward the upper electrode 64 among the electron currents of the first high frequency emitted from the susceptor 12 toward the upper electrode 64. At least one of the filter circuits 54A and 54B may selectively pass the second frequency power for ion attraction.

In the above embodiment, the DC ground part 52 is grounded in a DC manner via the filter circuit 54. However, the DC ground part 52 can be grounded in a DC manner via another route (e.g., via the chamber). Besides, although the DC voltage is applied from the variable DC power supply 78 to the upper electrode 64 in the above embodiment, the DC voltage may be applied to another member facing the plasma in the chamber 10.

In the lower side dual frequency application type of the above-described embodiment, the first and the second high frequency are simultaneously applied to the common high frequency electrode (susceptor 12). Therefore, the great intermodulation distortion occurs, and the effects of the present invention are increased. However, the present invention is not limited to the lower side dual frequency application type, and may be applied to an upper and lower side dual frequency application type in which a first high frequency for plasma generation is applied to the upper electrode and a second frequency for ion attraction is applied to the susceptor (lower electrode).

Further, the present invention can be applied to a single frequency application type in which a single high frequency for high frequency discharge is applied to only one of an upper and the lower electrode. Namely, in the single frequency application type as well, a frequency component (generally, a high frequency component) is generated by distortion in a plasma forming a nonlinear circuit of a high frequency for high frequency discharge. In accordance with the present invention, it is possible to obtain desired effects by selectively releasing any frequency component generated due to the distortion in the plasma and the high frequency for high frequency discharge to the ground line via the DC ground part.

The present invention is not limited to the plasma etching apparatus, and may be applied to other plasma processing apparatuses for performing plasma CVD, plasma oxidation, plasma nitriding, sputtering and the like. Further, the substrate to be processed in the present invention is not limited to the semiconductor wafer, but may be various substrates for a flat panel display, a photo mask, a CD substrate, a printed circuit board or the like.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a vacuum-evacuable processing chamber;
a first electrode for mounting thereon a substrate to be processed in the processing chamber;
a second electrode facing the first electrode in parallel in the processing chamber;
a processing gas supply unit for supplying a processing gas to a processing space between the first electrode and the second electrode;
a first high frequency power supply for applying a first high frequency for plasma generation of the processing gas to at least one of the first electrode and the second electrode;

a second high frequency power supply for applying to the first electrode a second high frequency for ion attraction from the plasma to the substrate;

a DC power supply for applying a DC voltage to a specific member exposed to the plasma in the processing chamber;

one or more DC ground electrodes, that are separate from a processing chamber wall, grounded in a DC manner and provided at a portion exposed to the plasma in the processing chamber, for allowing a DC current to flow through the plasma between the one or more DC ground electrodes and the specific member to which the DC voltage is applied; and one or more filter circuits, with each filter circuit of the one or more filter circuits including a series resonant circuit having a resonant frequency substantially the same as a frequency component generated in the plasma by intermodulation between the first and second high frequency, to selectively pass one or more frequency components generated by the intermodulation between the first and the second high frequency to a ground line via each of the one or more DC ground electrodes, wherein each of the one or more DC ground electrodes is electrically connected to at least one filter circuit of the one or more filter circuits, and wherein each filter circuit of the one or more filter circuits further includes a DC series circuit such that the DC current passes through the DC series circuit to the ground line, and such that each filter circuit includes both said DC series circuit and said series resonant circuit.

2. The plasma processing apparatus of claim 1, wherein each of the filter circuits includes: a first inductor having one terminal electrically connected to the DC ground electrodes; a capacitor having one terminal electrically connected to the other terminal of the first inductor and the other terminal of the capacitor electrically connected to the ground line; and a second inductor having one terminal electrically connected to the other terminal of the first inductor and the other terminal of the second inductor electrically connected to the ground line, wherein the first inductor and the capacitor form the series resonant circuit, and wherein the first inductor and the second inductor form the DC series circuit.

3. The plasma processing apparatus of claim 2, wherein the capacitor is a variable capacitor.

4. The plasma processing apparatus of claim 1, wherein each of the filter circuits is configured to selectively pass one of the frequency components, a frequency of each of the frequency components being lower than both of the first and the second high frequency.

5. The plasma processing apparatus of claim 4, wherein each of the filter circuits is configured to selectively pass one of the frequency components, a frequency of each of the frequency components being lower than an ion plasma frequency of the plasma.

6. The plasma processing apparatus of claim 4, wherein each of the filter circuits is configured to selectively pass one of the frequency components, a frequency of each of the frequency components being lower than or equal to 3 MHz.

7. The plasma processing apparatus of claim 1, wherein the second electrode is installed at the chamber via an insulating member or a space; the first high frequency power supply applies the first high frequency to the first electrode; and the DC power supply applies the DC voltage to the second electrode.

8. The plasma processing apparatus of claim 1, wherein each of the DC ground electrodes is attached in an electrically floating state to a side surface of the first electrode.

9. The plasma processing apparatus of claim 1, wherein each of the DC ground electrodes is attached in an electrically floating state to a wall of the processing chamber.

10. The plasma processing apparatus of claim 1, wherein a plurality of filter circuits are connected in parallel to one of the DC ground electrodes, and each of the filter circuits is configured to selectively pass one of the frequency components.

11. The plasma processing apparatus of claim 1, wherein the one or more DC ground electrodes include a plurality DC ground electrodes at a plurality of different places in the processing chamber, and the one or more filter circuits include a plurality of filter circuits each connected to a respective one of the plurality DC ground electrodes.

12. The plasma processing apparatus of claim 11, wherein each of the filter circuits independently selects the frequency of the frequency components to pass therethrough selectively.

13. The plasma processing apparatus of claim 1, wherein each of the filter circuits is configured to pass a harmonic frequency component of a plurality of harmonic frequency components generated by the intermodulation between the first and the second high frequency to the ground line via the DC ground electrodes.

14. The plasma processing apparatus of claim 1, wherein each of the filter circuits is configured to selectively pass one of the frequency components to remove deposits adhered to the DC ground electrodes.

15. The plasma processing apparatus of claim 1, wherein the frequency components pass through the series resonant circuit.

16. A plasma processing apparatus comprising:
a vacuum-evacuable processing chamber;
a first electrode for mounting thereon a substrate to be processed in the processing chamber;
a second electrode facing the first electrode in parallel in the processing chamber;
a processing gas supply unit for supplying a processing gas to a processing space between the first electrode and the second electrode;
a high frequency power supply for applying one or more frequencies to at least one of the first electrode and the second electrode;
a DC power supply for applying a DC voltage to a specific member exposed to the plasma in the processing chamber;
one or more DC ground electrodes, that are separate from a processing chamber wall, grounded in a DC manner and provided at a portion exposed to the plasma in the processing chamber, for allowing a DC current to flow through the plasma between the DC ground electrodes and the specific member to which the DC voltage is applied; and
one or more filter circuits each including a series resonant circuit having a resonant frequency substantially the same as a frequency component generated in the plasma by distortion caused by non-linearity of the plasma or any one of the high frequencies to a ground line via the one or more DC ground electrodes, to selectively pass one or more frequency components generated by the distortion caused by non-linearity of the plasma or any one of the high frequencies to the ground line via the one or more DC ground electrodes, wherein each of the one or more DC ground electrodes is electrically connected to at least one of the one or more filter circuits, and wherein each of the one or more filter circuits further includes a DC series circuit such that the DC current passes through the DC series circuit to the ground line and such that each of the one or more filter circuits includes both said series resonant circuit and said DC series circuit.

17. The plasma processing apparatus of claim 16, wherein each of the filter circuits is configured to pass a harmonic frequency component of a plurality of harmonic frequency components generated by distortion caused by non-linearity of the plasma or any one of the high frequencies to the ground line via the DC ground electrodes.

18. The plasma processing apparatus of claim 16, wherein each of the filter circuits is configured to selectively pass one of the frequency components to remove deposits adhered to the DC ground electrodes.

19. The plasma processing apparatus of claim 16, wherein the frequency components pass through the series resonant circuit.

\* \* \* \* \*